US006911836B2

(12) United States Patent
Cannon et al.

(10) Patent No.: US 6,911,836 B2
(45) Date of Patent: Jun. 28, 2005

(54) APPARATUS FOR FUNCTIONAL AND STRESS TESTING OF EXPOSED CHIP LAND GRID ARRAY DEVICES

(75) Inventors: Lonnie J. Cannon, Austin, TX (US); John Saunders Corbin, Jr., Austin, TX (US); David Lewis Gardell, Fairfax, VT (US); Jose Arturo Garza, Pflugerville, TX (US); Jeffrey Frank Kutner, Pleasant Valley, NY (US); Kenneth Carl Larsen, Georgetown, TX (US); Howard Victor Mahaney, Jr., Cedar Park, TX (US); John Joseph Salazar, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/645,038

(22) Filed: Aug. 21, 2003

(65) Prior Publication Data

US 2005/0040838 A1 Feb. 24, 2005

(51) Int. Cl.[7] .......... G01R 31/26

(52) U.S. Cl. .......... 324/765; 324/760; 324/158.1

(58) Field of Search .......... 324/755–756, 324/760, 765, 158.1; 165/80.1–80.5, 104.33; 361/702, 711

(56) References Cited

U.S. PATENT DOCUMENTS 5,841,634 A * 11/1998 Visser .......... 361/699
6,617,868 B1 * 9/2003 Needham .......... 324/760

* cited by examiner

*Primary Examiner*—Minh N. Tang
(74) *Attorney, Agent, or Firm*—Duke W. Yee; Mark E. McBurney; Lisa L. B. Yociss

(57) ABSTRACT

A chip testing system with improved thermal performance. In a preferred embodiment, a nest assembly of a chip testing apparatus includes tooling balls and a fitted frame for improving alignment of a coldplate and a chip surface. In preferred embodiments, the coldplate is of unibody design. Thermal performance is also improved by balancing the forces exerted on the coldplate using an adjustable hose mounting bracket. The bracket allows the forces exerted by the hoses on the coldplate to be adjusted so they balance and cancel other unwanted forces on the cold plate.

18 Claims, 6 Drawing Sheets

508
506
502
504
516
510
512
514

APPARATUS FOR FUNCTIONAL AND STRESS TESTING OF EXPOSED CHIP LAND GRID ARRAY DEVICES

BACKGROUND OF THE INVENTION

1. Technical Field

The present invention relates generally to integrated circuit chip testing, and particularly to an improved functional and stress testing apparatus.

2. Description of Related Art

High performance processor chips are frequently sorted by various high performance metrics so they can be matched with the class of machine for which they are intended. This typically involves investigating chip performance using functional test sequences at the extremes of various operational windows for several variables, among these being chip voltage, clock speed, power, and temperature. These test sequences at temperature extremes can also identify early life failures and reduce the likelihood of a faulty chip escaping and being assembled into high-function and high-cost devices.

Processor chips are typically attached to a temporary carrier (e.g., a temporary chip attach, or TCA) and then installed in a device tester. The tester controls the applied voltage, the clock frequency, the chip test sequences and power, and the chip temperature. Tester architectures vary significantly, but primary components typically include a test board that is compatible with the class of device to be tested, a control computer to control the test sequence, programmable power sources, other control hardware to control delivery of test resources (voltage, current, pneumatics, coolant fluid, etc.), a chiller to deliver a coolant fluid to the device being tested, network interface and communication hardware and software, and a test nest. The nest is that portion of the tester that physically accommodates the device under test (DUT).

Previous test apparatus suffered from shortcomings, such as the inability to accurately and repeatedly register the coldplate with respect to the TCA chip surface, which can contribute to chip damage. Further, the external loads applied to the coldplate were not well balanced, resulting in a poorly centered contact load between the coldplate and chip surface, which detracts from the thermal control performance of the assembly.

These and other issues are addressed by the present invention.

SUMMARY OF THE INVENTION

The present invention teaches an innovative chip test system and nest assembly. In a preferred embodiment, the nest assembly provides an automated means of rapidly installing (and removing) a TCA or other exposed chip Land Grid Array (LGA) devices onto a test board site to facilitate high-volume testing. Preferred embodiments of the present innovative nest assembly include a custom pogo pin socket to electrically connect the TCA LGA substrate to the test board by mechanically loading the TCA substrate into a test socket. Preferred embodiments also include means to geometrically center the load placed on the coldplate and chip for enhanced thermal interface performance, and means to accurately position the contact portion of the coldplate within the chip footprint while allowing unrestrained planar alignment between the coldplate and chip surfaces.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
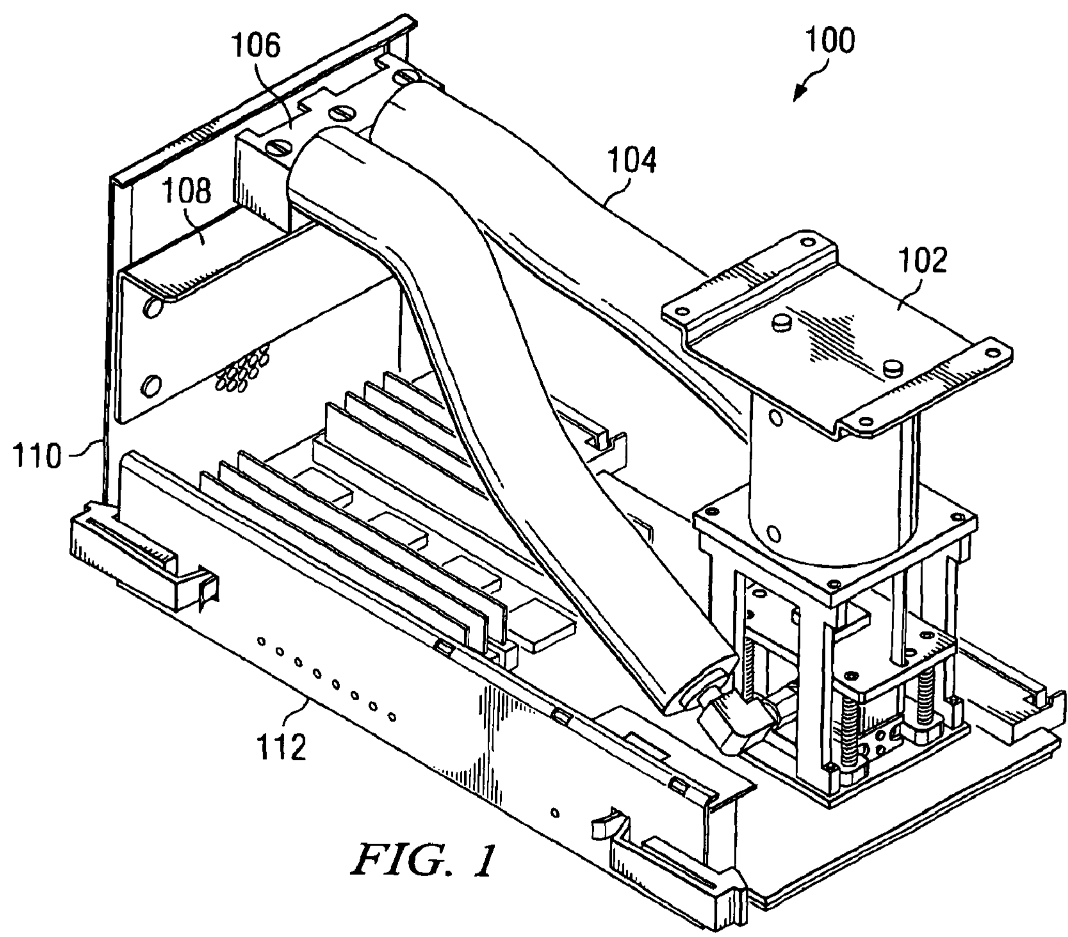
FIG. 1 shows the innovative nest assembly consistent with a preferred embodiment of the present invention.

FIG. 1 shows an innovative nest and test card assembly consistent with a preferred embodiment. The nest is part of a chip testing system and includes the region and apparatus where the DUT is retained inside the testing system.

The primary components include air cylinder and coldplate assembly 102 which is mounted directly to test card book assembly 112. Test card book assembly 112 is installed in a card cage where it is connected to a tester backplane. The rear end of the card cage contains bulkhead 110. Coolant line clamp 106 is mounted to clamp support bracket 108, which is mounted to bulkhead 110. Insulated coolant lines 104 supply chilled fluid to the nest region (specifically the coldplate or heat sink) to control temperature of the DUT.

The thermal performance of the system, i.e., uniformity of cooling of the DUT by the coldplate, is sensitive to the net force driving the DUT and coldplate together. The contact between the two should be as uniform as possible, which means the forces acting on the two should resolve at the vector center of the chip. Most of the net force arises from the suspension springs (see below) between the suspension mounting plate and the coldplate. However, other forces (referred to herein also as parasitic forces) also exist. For example, the wires that go to the heaters in the sink act as springs, and when the sink moves, the wires bend, imparting force. Also, coolant hoses 104 exert forces on the coldplate. The force imbalance imparted by coolant hoses 104 can be mitigated in a preferred embodiment using innovative adjustable clamp 106 that allows the point where hoses 104 anchor to bracket 108 to be changed. For example, the hoses can be allowed to hang free from the bracket 108 so that they reach a zero force, or minimum energy condition. The clamped end of the hose can then be moved using clamp 108 so that in the minimum energy condition the other end of the hose aligns to where it should be when attached to the coldplate in the down position. In this way, the innovative clamp allows for this particular parasitic force (i.e., that arising from the hoses themselves) to be reduced or mitigated.

However, in a further innovation, the net force exerted by the hoses on the coldplate and chip are not reduced to zero. Instead, the clamp is used to manipulate the hoses into a position where they balance and cancel other parasitic forces. For example, if the net forces exerted on the coldplate by the wires (mentioned above) is in one direction, a compensating force is introduced by (for example) adjusting the clamp 106 holding hoses 104 to the bracket 108. The system is adjusted in this way so that when the nest is in the down position, the net forces exerted on the coldplate are properly resolved and are geometrically centered within the contact area between the coldplate and chip. By balancing the forces on the coldplate in this way, the forces between the coldplate and the chip surface are centered, improving thermal performance of the interface.

Figure 2:
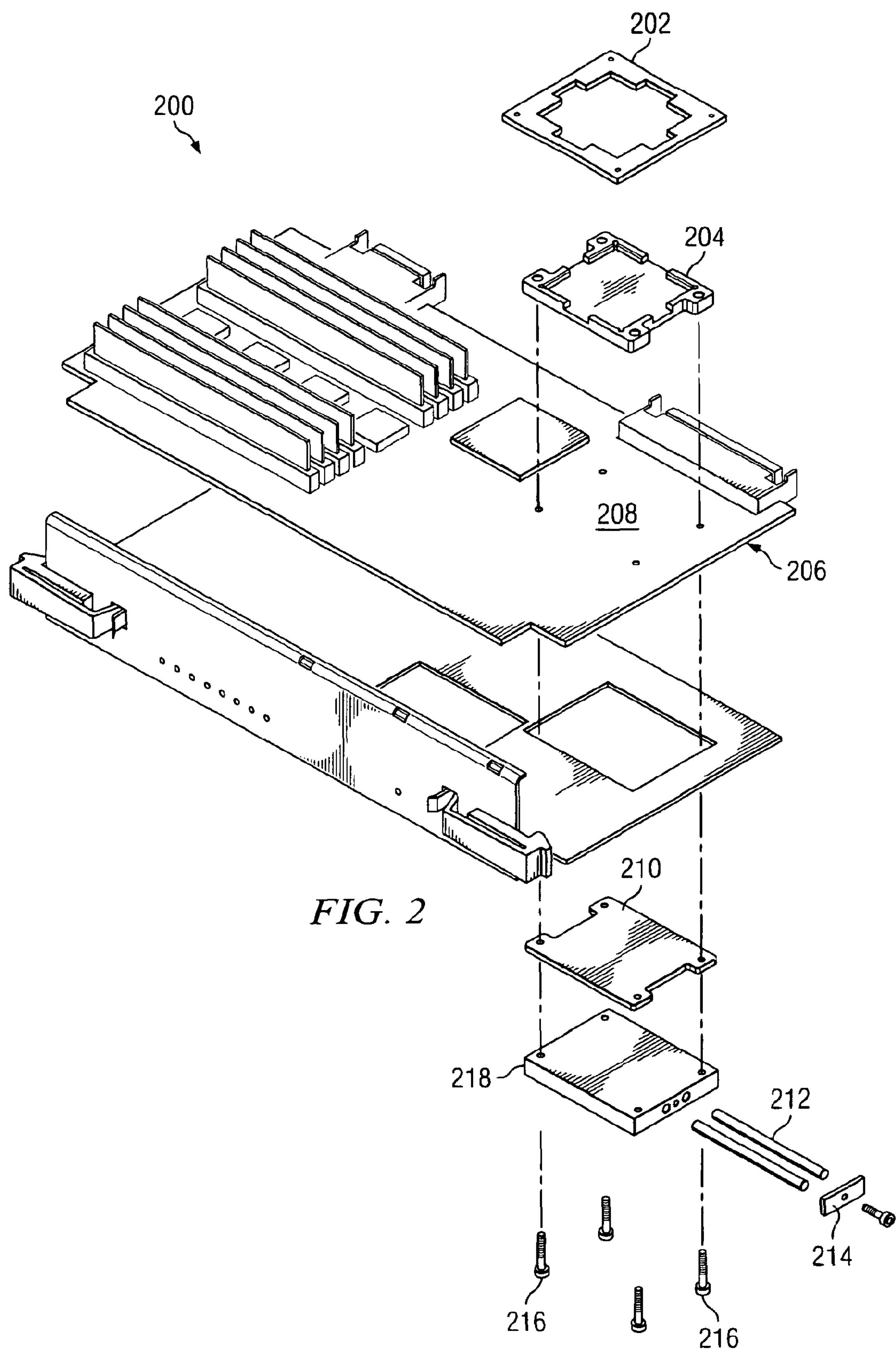
FIG. 2 shows the innovative nest base assembly consistent with a preferred embodiment of the present invention.

Nest base assembly 200 is shown in FIG. 2. Base assembly 200 provides the means to register and retain pogo pin socket 204 and provides the structural base to support and register the air cylinder and coldplate assembly with respect to the DUT. Nest base assembly 200 preferably includes pogo pin socket 204, although other LGA socket technologies are applicable, which is clamped to test board 206, also referred to herein as a "card", between backside stiffener 218 and topside clamp plate 202 using screw 216 that extend through stiffener 218, insulator 210, test board 206, socket 204 and engage threaded holes in clamp plate 202. Backside stiffener 218 is preferably included to limit deformation of test board 206 and socket 204 under the high load required to actuate socket 204 and electrically connect the DUT and the test board 206. A G10 insulator 210 or similar material is preferably used to insulate pads and other electrically conductive features on test board 206 from backside stiffener 218, which is preferably metallic. Backside stiffener 218 also preferably includes a pair of cartridge heaters 212 which are controlled by the test control code and are used to retard backside condensation. Heaters 212 are held in place by heater retainers 214. One advantage of clamping socket 204 to test board 206 between two semi-rigid structures (i.e., backside stiffener 218 and topside clamp plate 202) is the reduction of the effect of moisture absorption in the socket body plastic, which can distort some critical dimensions in the socket 204.

Nest site 208 shows where air cylinder and coldplate assembly 102 is preferably positioned.

Figure 3:
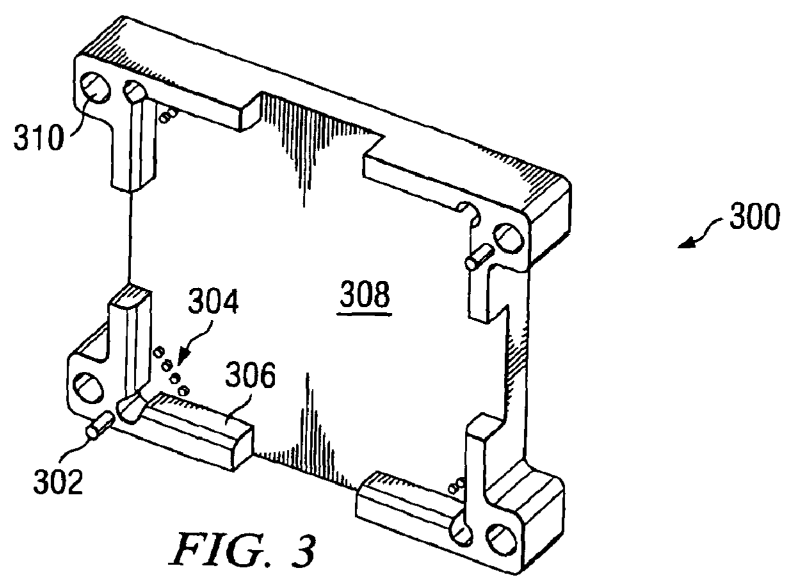
FIG. 3 shows the custom pogo pin socket consistent with a preferred embodiment of the present invention.

FIG. 3 shows custom pogo pin socket 300. The socket body is preferably machined Torlon™ and contains an array 308 of 1657 pogo pin test probes, retained in the body by a backside retainer plate in a preferred embodiment. Socket registration pins protrude from both the top and bottom of the socket, and use spring loaded corner support posts to support the DUT before engagement to the pogo pins. (Note that in FIG. 3, only the corners of array 308 are shown.) Clearance holes 310 are shown for mounting the socket 300, as described previously. Socket 300 is registered to the LGA pad array on the test board by two locator pins 302 that engage alignment holes in the test card. Locator pins 302 protrude through both sides of the socket body, providing registration of not only the socket to the board, but of the topside clamp plate to the socket and board. In preferred embodiments, the topside clamp plate has alignment holes that engage alignment pins 302 on the socket body. The DUT pocket 306 in the socket body is sized to accommodate the tolerance range of the 42.5 mm nominal TCA device without module centering devices. Additionally, the use of single-point probes in the LGA connector mitigates the possibility of test shorts or opens. Most pogo pin sockets used in LGA test applications include a stripper plate, which is a spring loaded plate that nominally rests above the exposed tip of the probe prior to DUT installation, and hence affords a level of probe protection. However, use of a stripper plate requires longer pogo pins, which can degrade high frequency electrical performance. In the present invention, it is preferred that no stripper plate is used. Instead, four small spring-loaded corner pins 304 are used to support the DUT above the exposed probe tips prior to pogo pin LGA socket compression. These corner support pins 304 provide pogo pin protection without compromising electrical performance.

Figure 4:
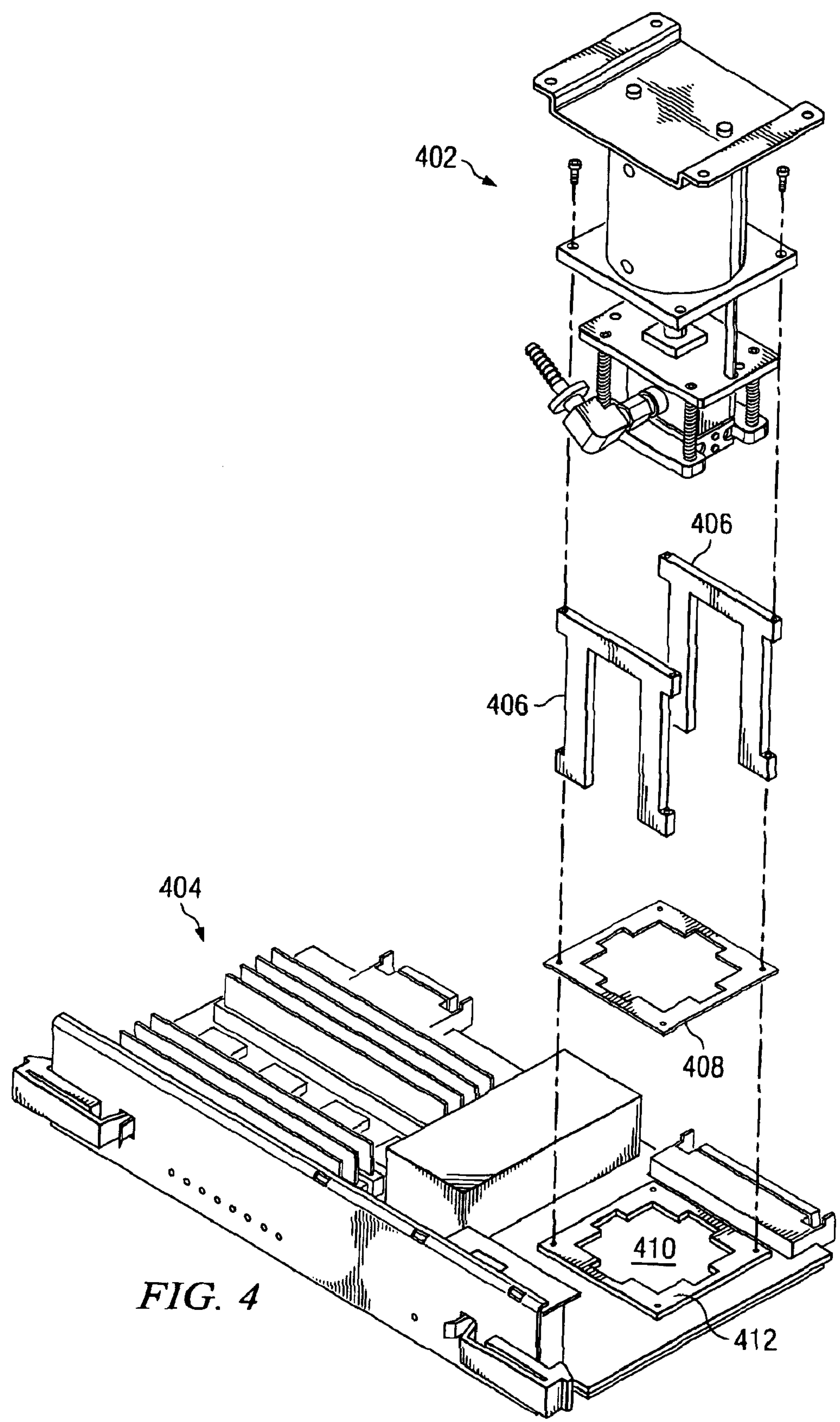
FIG. 4 shows the actuator assembly to the nest base assembly according to a preferred embodiment of the present invention.

FIG. 4 shows actuator assembly 402 and base or test board book assembly 404. Actuator assembly 402 is preferably attached directly to base assembly 404 via two side frames 406 that support the structure. Side frames 406 are pinned to clamp plate 202 (see FIG. 2), which allows teardown and reassembly of the structure for maintenance or repair without disrupting the registration between the actuator assembly and the socket. Additionally, module protector 408 preferably is G10 material and is installed between side frames 406 and the top clamp. This material protects the exposed BSM (Bottom Surface Metallurgy) of the DUT as it is installed in or removed from test socket 410. The top plate also provides registration holes that accommodate a vacuum pick/place/remove tool that picks up a DUT from a pickup station with identical registration holes, and minimizes handling damage to the DUT. This feature is feasible because the clamp plate is accurately registered to the socket position via locator pins 302 in the socket body (see FIG. 3). Nest mounting assembly 412 is mounted at nest site 208.

Figure 5:
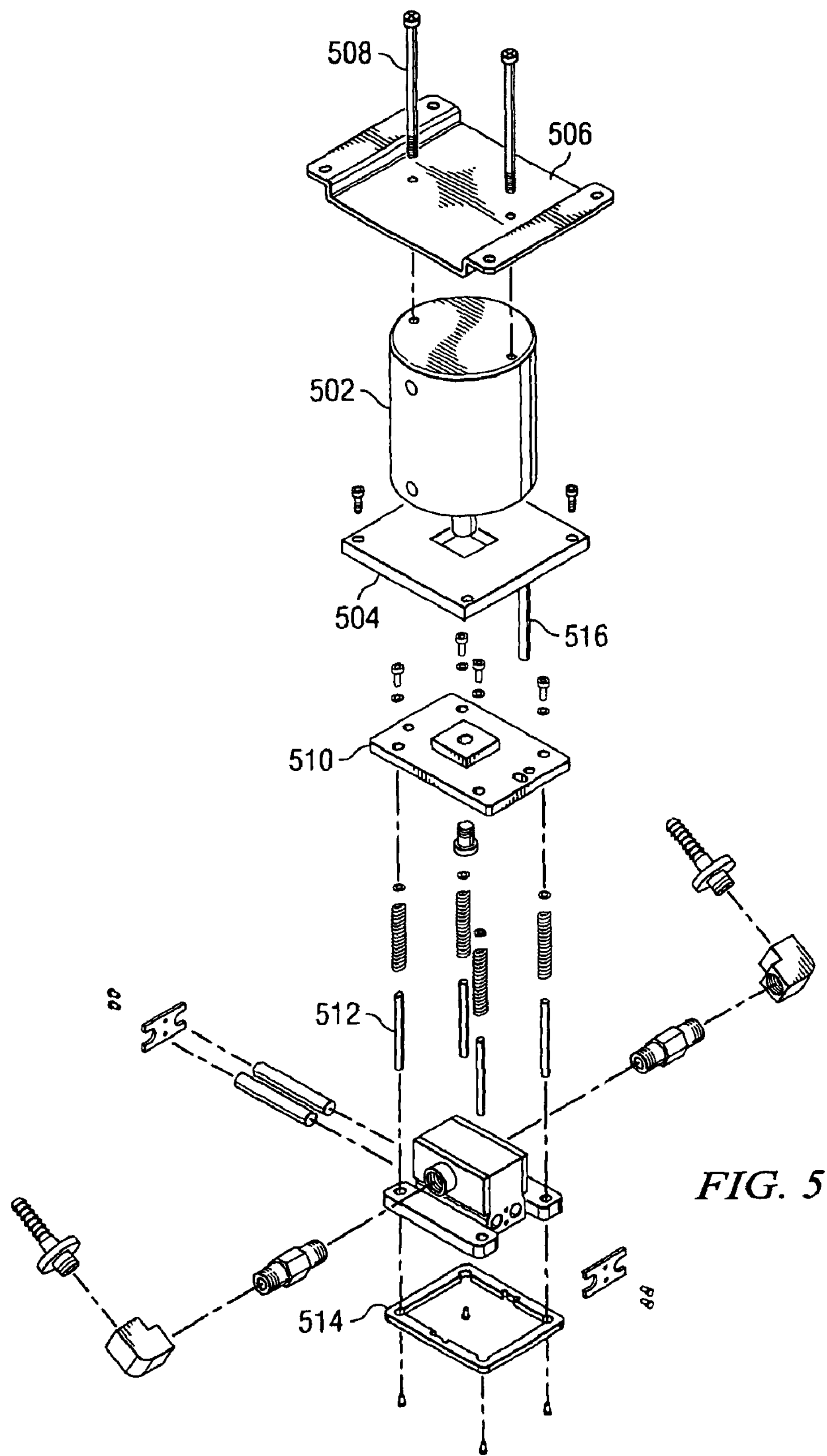
FIG. 5 shows the actuator/coldplate assembly consistent with a preferred embodiment of the present invention.

FIG. 5 shows an exploded view of the actuator/coldplate assembly. The purpose here is to apply a load directly on the perimeter of the TCA substrate, sufficient to create an electrical interconnection between the TCA and the test board via the pogo pin socket. For example, some applications require loads of about 150–160 lbs., depending on implementation. A second purpose of the actuator/coldplate assembly is to position the coldplate onto the exposed TCA chip surface, to allow the contact surfaces to align, and to apply a load sufficient to create a good thermal interface. An example implementation chip load is about 20–22 lbs., though this value too can vary. Additionally, the coldplate/chip contact load must be well controlled geometrically. If the contact load is not driven sufficiently close to the geometric center of the chip, the thermal interface performance is degraded.

The actuator/coldplate assembly includes a single-ended air cylinder 502 mounted to the cylinder mounting plate 504, which mounts directly to the side frames 406. A nest strain relief bracket 506 is also retained by the cylinder attachment screws 508. This bracket 506 is attached to the card cage chassis, which lends sufficient stability to the entire nest structure to survive typical shipping environments. A suspension mounting plate 510 is attached directly to the working end of the air cylinder 502. Suspension guide posts 512 are attached to the suspension mounting plate 510 at the top, and to the load frame 514 at the bottom. The suspension mounting plate/guide post/load frame assembly forms a rigid structure, which applies load directly to the TCA substrate perimeter when the air cylinder 502 is actuated. As the cylinder 502 is actuated the load frame 514 lowers until it engages the TCA substrate, and a load develops between the load frame and the TCA substrate. This load forces the TCA to the bottom of the socket pocket, compressing the pogo pin probes and providing electrical connection between the BSM of the TCA and the test card. Rotation about a vertical axis of the load frame 514 (and coldplate assembly that is suspended on the suspension mounting plate 510) is restricted by a guide pin 516 that is pressed into the cylinder mounting plate 504. An elongated clearance hole in the suspension mounting plate 510 freely travels along the guide pin 516 during actuation and retraction.

Figure 6:
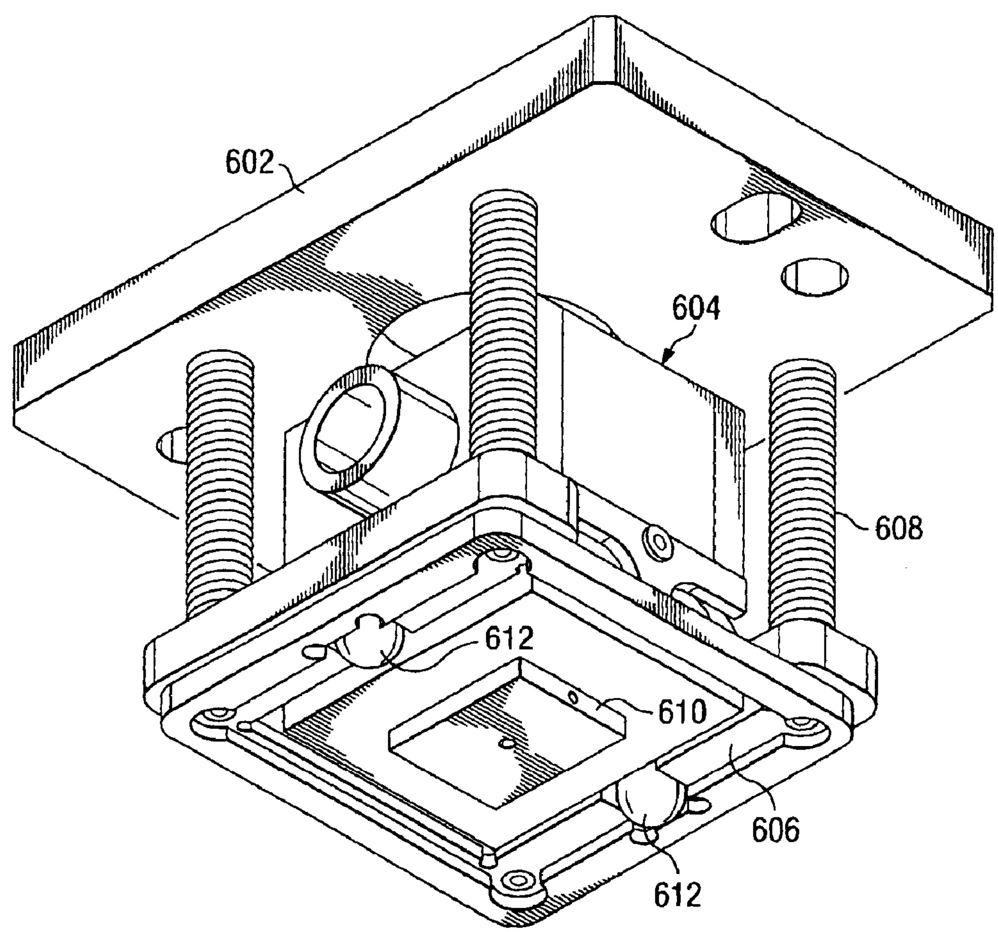
FIG. 6 shows the coldplate suspension according to a preferred embodiment of the present invention.

The coldplate suspension assembly is shown in FIG. 6. Suspension mounting plate 602 is connected to the coldplate assembly 604 and load frame 606 by load posts with suspension springs 608. The purpose of the coldplate suspension is to allow the coldplate pedestal 610 surface to align to the exposed chip surface, and to develop a controlled contact load, geometrically centered, between the coldplate and the chip. Additionally, the coldplate pedestal must be accurately positioned within the footprint of the chip. Pedestal overhang on a chip corner or edge can create significant stress risers that can fracture the chip. Hence, the pedestal is designed nominally smaller than the chip footprint. Additionally, a radius is maintained on the pedestal edge so that the contact stresses between the pedestal and chip are mitigated as the coldplate aligns with the chip surface. For example, the edges of pedestal 610 are rounded so that no sharp edge touches the chip surface. Likewise, the corners of pedestal 610 are also rounded. This prevents the initial contact between chip surface and pedestal 610 from involving a sharp corner or edge against the surface of the chip.

The coldplate location with respect to the socket is initially adjusted using a precision jig. This jig is temporarily installed during nest assembly and precisely fits within the socket pocket, and provides a cavity that precisely accommodates the coldplate pedestal. The cylinder mounting plate is adjusted laterally on the side frames until the coldplate pedestal is properly registered within the precision jig cavity. Once it is positioned, the top side frame screws are tightened, the precision jig is removed, and no further adjustment is required. The nest can be broken apart at the bottom of the side frames for repair or maintenance and subsequently reassembled without disturbing the registration of the coldplate with respect to the socket because the side frames are pinned to the top clamp plate.

Coldplate assembly 604 includes tooling ball locator 612 as described further below.

Figure 7:
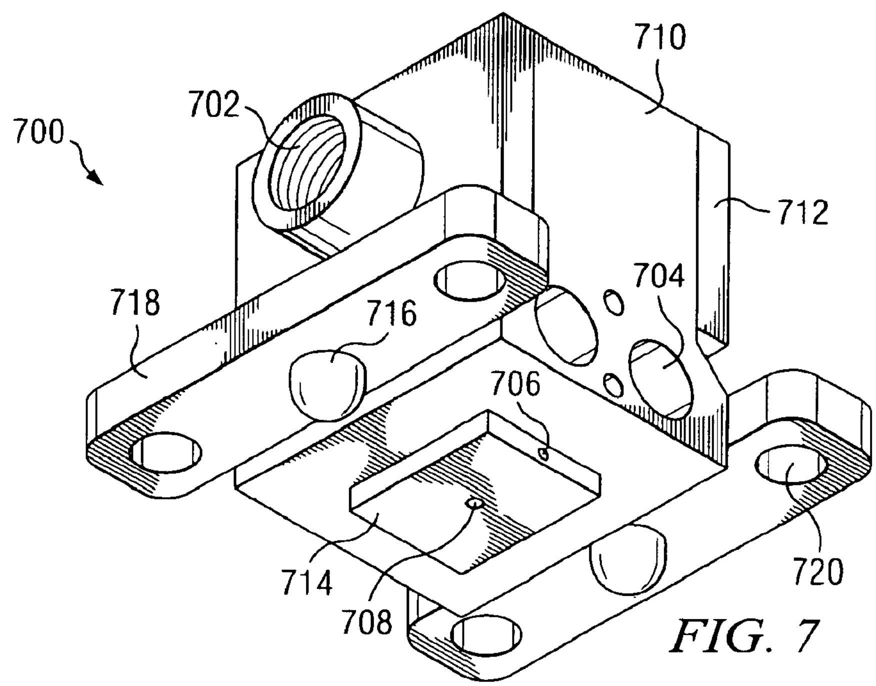
FIG. 7 shows the coldplate assembly consistent with a preferred embodiment of the present invention.
Figure 8:
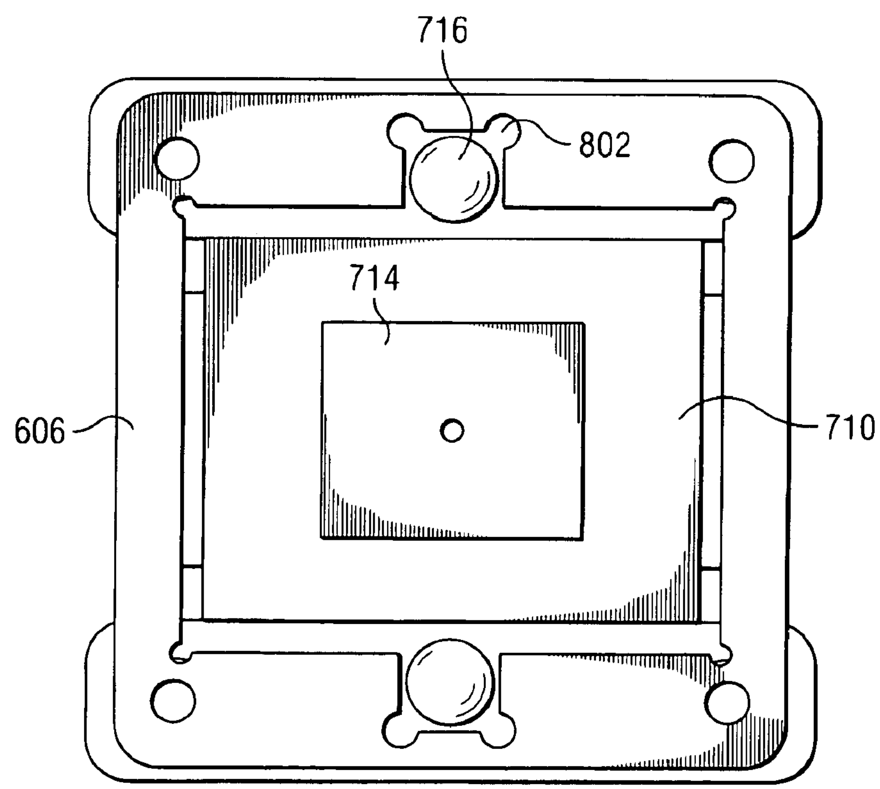
FIG. 8 shows a bottom view of the coldplate/load frame consistent with a preferred embodiment of the present invention.

FIGS. 7 and 8 show the coldplate assembly 700. In a preferred embodiment, the coldplate is a single integrated part. All of the features required to mount, align, and suspend the coldplate, as well as the features to accommodate cartridge heaters (holes 704), thermocouples (thermocouple receptacle 706), and helium flow (delivery port 708), are preferably integrated into a single part. This unibody construction reduces coolant leaks and makes the coldplate assembly more reliable. Cross flow channels are machined into the one-piece coldplate body 710 to accommodate coolant flow. End caps 712 are soldered directly onto the one-piece body for reliability, and provide the inlet and outlet fittings 702 for the coolant hoses.

The coldplate is preferably free to move axially along the load posts but compression springs maintain a preload which keeps the coldplate biased against the load frame 606 in the unactuated position. As the air cylinder is actuated, the suspension mounting plate 602 and coldplate are driven toward the socket and DUT. The coldplate pedestal 714 is preferably on the same plane as the bottom of the load frame 606, so therefore as the coldplate assembly approaches the DUT, initial contact will occur between the coldplate pedestal and the chip surface. The air cylinder and suspension mounting plate will continue downward until the load frame contacts the perimeter of the TCA substrate, and then will drive the TCA to the bottom of the socket pocket. As the load frame engages the substrate, the coldplate separates slightly from the load frame, a distance equivalent to the height of the chip with respect to the TCA substrate (e.g., less than 1 mm). There is a slight clearance between the load post clearance holes 720 and the suspension guide posts 512, sufficient to allow the coldplate suspension to rotate along the two orthogonal axes normal to the verticle axis. Hence, the coldplate is free to tilt around either the x- or y-axis in order to match the plane of the chip surface. Once the coldplate separates from the load frame, these two rotational degrees of freedom allow the coldplate pedestal to freely align to the chip surface. As the coldplate aligns to the chip surface, the transverse registration of the coldplate with respect to the load frame (and hence with respect to the socket and DUT) is maintained by a unique tooling ball locator feature 716. The tooling balls are preferably precision steel spherical bodies that are press fitted into the load flanges 718 of the coldplate assembly (a.k.a. heatsink). In other embodiments, the tooling balls are not spherical, but are actually cylindrical with rounded, semi-spherical ends. These tooling balls engage precision cutouts 802 in the load frame (see FIG. 8, below). As the coldplate rotates in the two available rotational degrees of freedom, the tooling balls remain captured in the load frame retention feature, and hence the transverse or XY positional registration of the coldplate is maintained even as it rotates to align with the DUT chip surface because the tooling balls prevent rotation about the z-axis (vertical axis of the nest assembly) and restricts any transverse motion of the coldplate with respect to the load frame.

The thermal performance of the coldplate/chip interface is preferably enhanced by controlling the suspension forces and external forces acting on the coldplate so that the resultant contact force between the two is close to the geometric center of the interface surfaces. As the contact force deviates from true center, the contact pressure distribution between the two components will become more variable, and the thermal interface performance will degrade. Contact force centroid control is achieved in a preferred embodiment primarily by using a low pivot point on the heatsink, by using low stiffness compression springs in the suspension, and by making the nominal preload compression of the springs large with respect to the deviations that would occur due to coldplate rotation during coldplate/chip surface alignment. Additionally, the external loads acting on the coldplate, primarily those from the coolant hoses, are preferably geometrically symmetric which contributes to good contact force centroid control.

To further enhance the contact load centroid control, an adjustable coolant hose clamp bracket as shown in FIG. 1 is included in preferred embodiments (as described above). Since the major source of external loads acting on the coldplate come from the coolant lines, a thermally insulated clamp made preferably from a low thermal conductivity plastic (to retard condensation) is provided that mounts directly to the bulkhead 110 of the test card cage chassis. These clamps 106 preferably attach directly to the coolant lines 104 (not the insulation) and can be adjusted on the mounting bracket. As the mounting bracket is moved laterally, the net contact force centroid location between the coldplate and the chip surface can be adjusted. Once a position close to the geometric center is achieved, the bracket is tightened and the thermal performance is optimized. The hose clamps provide a stable boundary condition for the coolant hoses, resulting in more consistent contact load centroid performance over time. Additionally, the coolant hose material is preferably selected to provide the least stiffness change over the operating temperature of the test nest, which also contributes to improved stability in the contact load centroid performance.

The current innovations provide many advantages over prior art systems. The primary advantages of the innovative nest design include: accurate registration of gimbaled coldplate pedestal with respect to the DUT using the tooling balls and engagement feature on the load frame; balancing and control of external loads to enhance load centroid thermal performance; integrated cold plate is simpler and more reliable; pinned design allows easy teardown and reassembly while maintaining positional tolerances (note that the coldplate suspension registration adjustment is made at the top plate on the side frames; once this adjustment is complete, the nest can be broken at the bottom of the frames (which are precision pinned) and hence reassembled without loss of registration); concurrent registration of the card, socket, and topside clamp plate using a single set of locator pins in the socket body; high performance pogo pin socket design features enhance durability; fixed socket pocket for easy installation/removal of DUT; clamped socket mitigates dimensional sensitivity to moisture absorption; single-point probes to accommodate DUT size tolerances without DUT centering apparatus; simplified socket design eliminates stripper plate and allows use of corner support posts for pogo pin protection; mechanical integration of cooling apparatus and pogo pin socket actuation; self-aligning coldplate to compensate for planar misalignment between the test chip surface and the coldplate; large throat to provide accessibility for DUT installation/removal, eliminates need for complex clamshell designs; coldplate suspension optimized for load centroid performance (low pivot, soft springs, preload displacement with respect to tolerances); mitigation of contact stress on chip via radiused coldplate pedestal and registration control; load frame with heatsink suspension provides independent loading of chip and substrate.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An integrated circuit testing apparatus that provides thermal control of a device under test, comprising:

a coldplate, the coldplate including tooling balls formed on the coldplate;

a load frame positioned beneath the coldplate, the load frame including locator features;

wherein the locator features engage the tooling balls such that rotation of the coldplate is restricted about a first axis of rotation, but is permitted about second and third axes of rotation, and such that transverse motion of the coldplate with respect to the load frame is restricted.

2. The apparatus of claim 1, wherein the tooling balls are cylindrical with semi-spherical ends.

3. The apparatus of claim 1, wherein the tooling balls are formed on load flanges of the coldplate.

4. The apparatus of claim 1, wherein the coldplate includes features for mounting, aligning, and suspending the coldplate, and features for accommodating cartridge heaters, thermocouples, and gas flow; and wherein the coldplate and features are of unibody design.

5. The apparatus of claim 1, further comprising side frames for supporting a nest structure that includes the coldplate, wherein the side frames are pinned to a clamp plate such that the side frames can be separated from the clamp plate and reassembled while maintaining positional tolerances.

6. The apparatus of claim 1, further comprising a pogo pin socket having probe pins and supported by corner pins, the corner pins supported by springs; wherein a load placed on the socket compresses the corner pins and the probe pins of the socket.

7. An integrated circuit testing apparatus that provides thermal control of a device under test, comprising:

a nest assembly that includes a coldplate, the coldplate being supplied with chilled fluid by fluid lines for cooling the device under test;

wherein first ends of the fluid lines connect to the coldplate to supply chilled fluid to and remove chilled fluid from the coldplate, and wherein second ends of the fluid lines connect to an adjustable clamp; and wherein the fluid lines exert a force on the coldplate, and wherein the force exerted by the fluid lines cancels other forces exerted on the coldplate such that a net force between the coldplate and the device under test is substantially resolved at a vector center of the device under test.

8. The apparatus of claim 7, wherein the coldplate includes features for mounting, aligning, and suspending the coldplate, and features for accommodating cartridge heaters, thermocouples, and gas flow; and wherein the coldplate and features are of unibody design.

9. The apparatus of claim 7, further comprising side frames for supporting a nest structure that includes the coldplate, wherein the side frames are pinned to a clamp plate such that the side frames can be separated from the clamp plate and reassembled while maintaining positional tolerances.

10. The apparatus of claim 7, further comprising a pogo pin socket having probe pins and supported by corner pins, the corner pins supported by springs; wherein a load placed on the socket compresses the corner pins and the probe pins of the socket.

11. The apparatus of claim 7, wherein the adjustable clamp attaches to a bracket on a card cage bulkhead.

12. The apparatus of claim 7, wherein the coldplate includes tooling balls formed thereon, and wherein the tooling balls fit into alignment structures of a load frame to restrict movement of the coldplate about an axis substantially perpendicular to the plane of the coldplate and such that transverse motion of the coldplate with respect to the load frame is restricted.

13. A method of testing an integrated circuit utilizing a testing apparatus, comprising the steps of:

supplying a coldplate of the testing apparatus with chilled fluid, wherein the coldplate includes structures protruding from the coldplate;

positioning the coldplate adjacent to a load frame, the load frame having receptacles positioned to engage the structures protruding from the coldplate;

aligning the coldplate with a device under test;

wherein when the coldplate is positioned adjacent to the load frame, the structures engage the receptacles such that the coldplate is free to rotate about an axis perpendicular to the coldplate, but not allowed to rotate about two axes parallel with the coldplate, and such that transverse motion of the coldplate with respect to the load frame is restricted.

14. The method of claim 13, wherein the structures are semispherical tooling balls fitted into load flanges of the coldplate.

15. The method of claim 13, wherein the structures are cylinders with semispherical ends.

16. The method of claim 13, wherein the coldplate includes features for mounting, aligning, and suspending the coldplate, and features for accommodating cartridge heaters, thermocouples, and gas flow; and wherein the coldplate and features are of unibody design.

17. The method of claim 13, further comprising side frames for supporting a nest structure that includes the coldplate, wherein the side frames are pinned to a clamp plate such that the side frames can be separated from the clamp plate and reassembled while maintaining positional tolerances.

18. The method of claim 13, further comprising a pogo pin socket having probe pins and supported by corner pins, the corner pins supported by springs; wherein a load placed on the socket compresses the corner pins and the probe pins of the socket.

* * * * *